United States Patent [19]
Yang

[11] Patent Number: 5,411,995
[45] Date of Patent: May 2, 1995

[54] FREE RADICALLY CURABLE FORMULATIONS EMPLOYING DITHIOLATE CATALYSTS

[75] Inventor: Darchun B. Yang, West Hartford, Conn.

[73] Assignee: Loctite Corporation, Newington, Conn.

[21] Appl. No.: 44,826

[22] Filed: Apr. 8, 1993

Related U.S. Application Data

[62] Division of Ser. No. 556,019, Jul. 20, 1990, Pat. No. 5,217,760.

[51] Int. Cl.$^6$ ............................................. C08F 2/50
[52] U.S. Cl. ............................ 522/27; 522/49; 522/54; 522/57; 427/517; 502/162; 502/165; 502/166; 502/167
[58] Field of Search ................ 427/517; 502/162, 165, 502/166, 167; 522/27, 49, 57, 54

[56] References Cited

U.S. PATENT DOCUMENTS

| | | | |
|---|---|---|---|
| 2,673,151 | 3/1954 | Gerhart | 522/27 |
| 2,716,633 | 8/1955 | Englehardt | 522/27 |
| 3,378,510 | 4/1968 | Wheat | 260/23.7 |
| 3,525,721 | 8/1970 | Jorgensen | 260/80.72 |
| 3,639,370 | 2/1972 | Edl et al. | 260/88.7 |
| 3,878,263 | 4/1975 | Martin | 260/825 |
| 3,956,235 | 5/1976 | Pasternack | 522/27 |
| 3,991,039 | 11/1976 | Gunter et al. | 528/374 |
| 4,018,604 | 4/1977 | Bachman | 96/48 |
| 4,018,851 | 4/1977 | Baccei | 260/859 |
| 4,021,310 | 5/1977 | Shimizu et al. | 203/8 |
| 4,035,355 | 7/1977 | Baney et al. | 260/46.5 |
| 4,082,876 | 4/1978 | Miura | 428/159 |
| 4,287,330 | 9/1981 | Rich | 526/270 |
| 4,295,909 | 10/1981 | Baccei | 156/307.3 |
| 4,309,526 | 1/1982 | Baccei | 528/75 |
| 4,348,454 | 9/1982 | Eckberg | 428/334 |
| 4,380,613 | 4/1983 | Nativi | 525/440 |
| 4,439,600 | 3/1984 | Moran, Jr. | 528/392 |
| 4,477,326 | 10/1984 | Lin | 204/159.13 |
| 4,503,208 | 3/1985 | Lin et al. | 528/15 |
| 4,504,629 | 3/1985 | Lien et al. | 525/288 |
| 4,524,185 | 6/1985 | Hinderer | 525/328.2 |
| 4,543,397 | 9/1985 | Woods et al. | 525/455 |
| 4,575,545 | 3/1986 | Nakos et al. | 526/242 |
| 4,605,465 | 8/1986 | Morgan | 522/27 |
| 4,632,950 | 12/1986 | Kmiec et al. | 524/202 |
| 4,640,849 | 2/1987 | Woods et al. | 427/54.1 |
| 4,640,940 | 2/1987 | Jacobine et al. | 522/99 |
| 4,684,538 | 8/1987 | Klemarczyk | 427/54.1 |
| 4,814,401 | 3/1989 | Obrecht et al. | 526/204 |
| 4,826,888 | 5/1989 | Sasaki | 522/27 |

FOREIGN PATENT DOCUMENTS

| | | |
|---|---|---|
| 0229033 | 1/1986 | European Pat. Off. . |
| 49-6203 | 2/1974 | Japan . |
| 102974 | 6/1982 | Japan . |
| 77046 | of 1986 | Japan . |
| 76578 | 4/1986 | Japan . |
| 278910 | 11/1988 | Japan ................ 522/57 |

OTHER PUBLICATIONS

Kosar, "Light Sensitive Systems", John Wiley & Sons, New York 1965, pp. 180–181.

Translation Of Japanese Patent Document 29410 of 31 Jan. 1989 (Application 184682 of 25 Jul. 1987). Himori. Macromolecules, 21 2297-9 (1988) "Extremely High Molecular Weight Polymer Formation Using a Photoinitiation System of Xanthate Fixed at an Oriented Bilayer Surface".

Poly.Prep.Am.Chem.Soc.Div.Polym.Chem., 29, 6–7 (1988) "Photoinitiated Block Copolymer Formation Via the 'Living' Dithiocarbamate Free Radical Technique".

*Primary Examiner*—Mark A. Chapman
*Attorney, Agent, or Firm*—Vidas, Arrett & Steinkraus

[57] ABSTRACT

Xanthate, dithiocarbamate and dithiophosphate salts of transition metals, together with a coinitiator selected from organic halogen and tertiary amine compounds provide light activated initiator systems for radically polymerizable ethylenically unsaturated compounds such as (meth)acrylate esters.

20 Claims, No Drawings

FREE RADICALLY CURABLE FORMULATIONS EMPLOYING DITHIOLATE CATALYSTS

This is a divisional of application Ser. No. 07/556,019 filed on Jul. 20, 1990, now U.S. Pat. No. 5,217,760.

FIELD OF THE INVENTION

The present invention pertains to photocurable compositions, specifically compositions of radically polymerizable ethylenically unsaturated compounds which include as photoinitiators a combination of dithiocarbamate, xanthate or dithiophosphate salt of a transition metal and a coinitiator selected from organic halogenated compounds and tertiary amines.

BACKGROUND OF THE INVENTION

The participation of xanthate and dithiocarbamate compounds in free radical reactions has been previously reported. The participation of dithiocarbamate and xanthate salts in free radical reactions appears very complex and occasionally contradictory. In rubbers which include unsaturated sites (e.g. natural rubber, polybutadienes and various unsaturated copolymers), these compounds are frequently used as vulcanizing agents, usually in conjunction with at least one other compounds. Examples are the abstracts of JP (1982)/102974 and EP 184301. Similar activity is reported for saturated rubbers containing small amounts of epoxy or halo groups (U.S. Pat. Nos. 3,525,721 and 4,524,185). Fe or Mg dialkyldithiocarbamates cause cure of mercaptan terminated polymers in the presence of air (U.S. Pat. No. 3,991,039).

Use of xanthate or dithiocarbamate salts is taught as part of a peroxy catalyst system for emulsion polymerization of chloroprene monomer and comonomer mixtures in U.S. Pat. No. 4,814,401.

In U.S. Pat. No. 3,639,370 dialkyldithiocarbamates with an unsaturated peroxy compound such as t-butyl permalinate or t-butyl perethyl fumerate are taught as a low temperature polymerization initiation system for vinyl compounds such as acrylic esters and unsaturated polyesters.

On the other hand, dithiocarbamates are also reported as free radical inhibitors in other polymerization or vulcanization reactions.

In U.S. Pat. Nos. 3,378,510 and 4,632,950 dialkyidithiocarbamate salts are disclosed as scorch retarders (on i.e. inhibitors of premature vulcanization) for peroxy vulcanized saturated rubbery polymers. (U.S. Pat. No. 4,632,950 also identifies chlorinated polyethylene, 1,4-polybutadiene and fluoroelastomers as suitable polymers.)

U.S. Pat. No. 4,018,604 teaches dialkyldithiolcarbamates (e.g. Zn dimethlydithiolcarbamate) as an additive to prevent fogging of non-silver free radical photosensitive films.

U.S. Pat. No. 4,021,310 teaches use of $O_2$, copper dialkyidithiolcarbamates and a conventional inhibitor such hydroquinone as inhibitors of polymerization in fractional distillations of acrylic monomers. Table 1 of this reference demonstrates that the dithiocarbamate is an essential ingredient of this inhibitor system.

JP (1986)/76578 describes a two-liquid type resin composition utilizing an acrylic monomer. A peroxide (e.g. cumene hydroperoxide) is placed in one part of the composition and a vanadium compound, together with a nickel xanthate compound are used in the second part. At least a portion of the monomer must have an additional functional group, as for instance a carboxylic or phosphate acid group, a hydroxy, amino amide or ether group. This reference discloses that the xanthate compound acts as a stabilizer against decomposition of the vanadium compound, and as an inhibitor against premature gelling of the vanadium containing monomer solution, not as an active ingredient of the cure system.

Xanthate and dithiocarbamate compounds have also been reported in photoinitiated or photo crosslinked polymer systems but only in systems which included a conventional radical photoinitiator (an organic aryl carbonyl photoinitiator) or in which the xanthate or dithiocarbamate specie were terminal ester groups on a prepolymer. References showing use of a dithiocarbamate metal salt in a photocurable composition free of an aryl carbonyl photoinitiator are not known.

*Macromolecules*, 21 2297-9 (1988) appears to disclose a xanthate ligand polymer for initiating polymerization of a quartanary ammonium complex salt of styrene sulfonic acid.

*Poly. Prep. Am. Chem. Soc. Div. Polym. Chem.*, 29, 6-7 (1988) describes photoinitiated polymerization of styrene and methylmethacrylate. The initiator is a tetraethylthiuram disulfide which thermally initiates the formation of a polymer having terminal dithiocarbamate ester or ligand groups. These groups in turn can be photolyzed to initiate polymerization of a second monomer. The dithiocarbamates are not metal salts. JP (1989)/29401 reportedly contains a similar disclosure.

JP (1986)/77046 is reported as describing photocuring compositions for printing plates including acrylic monomers, a conventional film forming polymer, a photoinitiator and a metal dithiocarbamate salt such as nickel di-n-butyldithiolcarbamate. A chlorinated triazine compound is included in the example formulation.

JP (1974)/6203 is reported to describe a heat developable photographic material employing a dithiocarbamate (e.g. Na diethyldithiocarbamate) and an aromatic carbonyl compound (e.g. 9,10-phenanthraquinone) as photosensitizers for PVC resins coated on polyester films. No image was formed when the 9,10-phenanthraquinone was omitted from the composition.

SUMMARY OF THE INVENTION

In one aspect the invention comprises a novel photoinitiator for radically polymerizable ethylenically unsaturated compounds, the photoinitiator consisting essentially of a mixture of a transition metal xanthate, dithiocarbamate or dithiophosphate salt and a coinitiator compound selected from organic halide compounds and tertiary amines.

Novel photocurable compositions are another aspect of the invention. The photocurable compositions comprise a photoinitiator described above and a radically curable ethylenically unsaturated compound, suitably a (meth)acrylate ester.

Still another aspect of the invention is a process for forming a cured polymeric encapsulant over a substrate comprising applying the photocurable composition of the invention to the substrate and irradiating the composition with actinic radiation.

Light screening by conventional photoinitiators requires reductions in optimal photoinitiator levels as the film thickness increases. Greater than about 1 milimeters, the screening effect became very marked. Most conventional photoinitiators are ineffective at depths below about 2.5 mm (100 mils). At least most of the inventive photoinitiators undergo a photobleaching effect in the visible-near UV range as they are irradiated. Consequently, as curing proceeds, light of the desired wavelength for initiating cure is permitted to penetrate to greater depths where uncured material remains. Photocuring of films having thicknesses of greater than the conventional 2.5 mm maximum can, therefore, easily be accomplished with the inventive photoinitiator systems. This photobleaching effect makes the photoinitiation system of the invention especially advantageous in deep section curing applications such as electronic potting applications.

The xanthate, dithiocarbamate and dithiophosphate salts provide the photoinitiators with a wide spectrum of utilities. Solubilities of the salts can be adjusted by modifying organic groups in the xanthate, dithiocarbamate and dithiophosphate moieties and, by varying the transition metal, the photoinitiator can be optimized for a particular wavelength spectrum of available light.

The polymer chains initiated by the inventive systems have at least one terminal xanthate or dithiocarbamate group which may improve bonding of the cured polymers to metallic substrates.

Dithiocarbamate and xanthate salts are commercially available and relatively inexpensive providing a further advantage for the present system compared to some specialty initiators which have no other uses and, therefore, have high synthesis costs.

DETAILED DESCRIPTION OF THE INVENTION

The xanthate, dithiocarbamate and dithiophosphate salts used in the inventive photoinitiators are dithiolate compounds which may be represented by the formula:

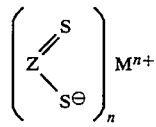

where Z is $R_2NC$, $R^1OC$ or $(OR^1)_2P$, M is an n valent transition metal, n is 1, 2 or 3, R is a hydrocarbon or hydroxyhydrocarbon group and $R^1$ is a hydrocarbon group which is optionally substituted by one or more hydroxyl or halo groups or interrupted by one or more ether oxygen atoms. Examples of suitable transition metals are Zn, Cu, Co, Ni, Mo, Mn, Cr, Ru, Fe and V. Zn, Cu, Co and Ni are preferred.

The coinitiator compound is an organic halogen compound or tertiary amine compound which will readily undergo an electron transfer reaction with the dithiolate compound when irradiated.

Examples of halogenated hydrocarbons include simple chloro, substituted hydrocarbons such as carbon tetrachloride, chloroform, dichloro methane, trichloroethane, trichloroethylene, benzylchloride, etc. Polymeric halogenated compounds may also be employed, for instance chlorinated natural rubber, chlorinated polyethylene, chlorinated polypropylene, chlorinated polyisoprene, chloroprene rubber, rubber hydrochloride, polyvinyl chloride, vinyl chloride-acrylonitrile copolymers, polyvinylidene chloride, vinylidene chlorideacrylonitrile copolymers, chlorosulfonated polyethylene, epichlorohydrin rubber, etc. Corresponding fluoro, bromo or iodo substituted compounds may also be employed.

The tertiary amines may be trialkyl amines such as triethylamine, corresponding amines in which the alkyl group is substituted by a hydroxy group such as N-methyldiethanolamine, aromatic amines such as triphenylamine and N,N-dialkylaniline and N-alkyl substituted cyclic amines such as N-methylpiperidine, 3-pyrrolidino-1,2-propanediol, 1-pyrrolidinebutyronitrile, N-methylmorpholine, etc. Polymeric tertiary amines may also be employed such as poly(dimethylaminoethyl methacrylate). Preferred N,N-dialkylanilines are diaikylanilines substituted in one or more of the ortho, meta, or para positions by the following groups: methyl, ethyl, isopropyl, t-butyl, n-pentyl, n-hexyl, phenyl, 3,4-tetramethylene, trifluoromethyl, acetyl, ethoxycarbonyl, carboxylate, acetoxy, hydroxy, ethoxy, methylthio, ethylthio, acetylthio, isopropylthio, fluoro, chloro, bromo and iodo. Representative examples of N,N-dialkylanilines useful in the present invention are N,N-dibenzylaniline, N,N-dimethylaniline, 4-cyano-N,N-dimethylaniline, 4-acetyl-N,N-dimethylaniline, 4-bromo-N,N-dimethylaniline, 4-chloro-N,N-dimethylaniline, 4-fluoro-N,N-dimethylaniline, 4-ethoxy-N,N-dimethylaniline, 4-amino-N,N-diethylaniline, 3-hydroxy-N,N-dimethylaniline. Particularly preferred N,N-dialkylanilines are substituted with an alkyl group in the ortho position, and include 2,5-diisopropyl-N,N-dimethylaniline and 2,6-diethyl-N,N-dimethylaniline.

The preferred radically polymerizable ethylenically unsaturated compounds employed in the photocurable compositions of the invention are (meth)acrylic ester compounds.

One class of monomers suited for use in this invention comprises acrylate esters having the following general formula:

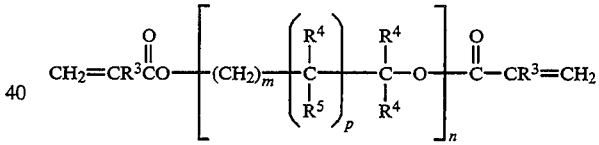

wherein $R^4$ represents a radical selected from the group consisting of hydrogen, halogen, alkyl of 1-4 carbon atoms, inclusive, hydroxyalkyl of 1-4 carbon atoms inclusive, phenyl, and

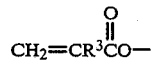

$R^3$ is a radical selected from the group consisting of hydrogen, halogen, and lower alkyl of 1-4 carbon atoms; $R^5$ is a radical selected from the group consisting of hydrogen, —OH and

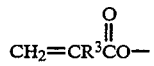

m is an integer equal to at least 1, e.g. from 1 to 8 or higher, for instance, from 1 to 4 inclusive, n is an integer equal to at least 1, for example, 1 to 20 or more; and p is 0 or 1.

The polymerizable polyacrylate esters utilized in accordance with the invention and corresponding to the above general formula are exemplified by, but not restricted to, the following materials: diethylene glycol dimethacrylate, triethylene glycol dimethacrylate, tetraethylene glycol dimethacrylate, dipropylene glycol dimethacrylate, di-(pentamethylene glycol) dimethacrylate, tetraethylene diglycerol diacrylate, diglycerol tetramethacrylate, tetramethylene dimethacrylate, ethylene dimethacrylate, neopentyl glycol diacrylate, and trimethylol propane triacrylate. Of these, the preferred monomers are triethylene glycol dimethacrylate and polyethylene glycol dimethacrylate.

In addition to the monomers described above, epoxy acrylate monomers (i.e. the reaction products of epoxy compounds or prepolymers with acrylic or methacrylic acids) and urethane acrylate capped prepolymers such as those described in U.S. Pat. Nos. 4,309,526, 4,295,909, 4,018,851, 4,380,613, and 4,439,600 may be employed. Also useful are (meth)acrylic esters of alkoxylated bisphenol A, for instance ethoxylated bisphenol A diacrylates of the formula:

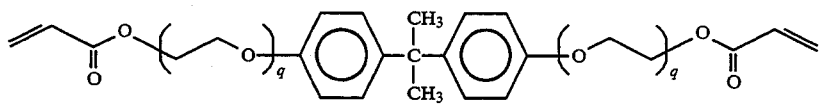

where q is an integer to at least 1, e.g. from 1 to 8 or higher, for instance, from 1 to 4 inclusive, and structurally similar compounds.

Although di-and and other poly(meth)acrylate esters are preferred, monoacrylate esters can be used, particularly if the non-acrylate portion of the ester contains a hydroxyl or amino group, or other reactive substituent which serves as a site for potential crosslinking. Examples of useful mono(meth)acrylate monomers are hydroxyethyl methacrylate, cyanoethyl acrylate, t-butylaminoethyl methacrylate, glycidyl methacrylate, dicyclopentadiene methacrylate, lauryl acrylate and lauryl methacrylate. Further details on useful monomers may be found in U.S. Pat. No. 4,287,330 at Col. 3, line 51—Col. 6, line 44.

Silicones having (meth)acrylate ester functionality are another class of monomers which may be used in the invention. Examples of such silicones may be found in U.S. Pat. Nos. 3,878,263, 4,035,355, 4,348,454, 4,477,326, 4,503,208, 4,504,629, 4,575,545, 4,575,546, 4,640,940 and 4,684,538, all incorporated herein by reference.

In order to enhance shelf life of the compositions, it may be desirable to remove metal ions, if present, from the polymerizable monomer. This may be particularly desirable in the event that commercially obtained monomers, which often contain significant amounts of metal ions are employed in these compositions. Removal of metal ions may be effected by means known to those skilled in the art.

Other radically polymerizable ethylenically unsaturated compounds may also be employed instead of or in admixture with (meth)acrylate esters. Examples include maleic acid esters, fumeric acid esters, half esters of such acids, cinnamate esters, acrylamide and N-substituted acrylamides, acrylonitrile, vinyl functional compounds such as vinyl acetate, N-vinyl carbazole and N-vinyl pyrrolidone, styryl functional compounds such as styrene, divinylbenzene, the styryloxy compounds described in U.S. Pat. Nos. 4543397, 4640849 and in EP 0229033.

The compositions of the invention may comprise a single type of polymerizable monomer or may comprise a blend of two or more different polymerizable monomers. Preferably they are substantially 100% solids formulations, i.e. they cure to solids without substantial weight loss due to solvent volatilization, or the like.

Mixtures of ethylenically unsaturated compounds which are not homopolymerizable by a radical mechanism but which will copolymerize radically, such as mixtures of maleic anhydride or vinyl ethers with each other or with other monomers, may also be employed.

If the monomer has both radically polymerizable functionality and a tertiary amino group or a Cl, Br or I group, it may be possible to eliminate the separate coinitiator additive from the formulation in some cases because the monomer can also function as a coinitiator. Examples of such dual functional monomers include dimethylaminioethyl methacrylate, chlorobenzyl methacrylate and chloroethyl acrylate.

While the dithiolate may be employed in the monomer as a fine suspension, it is preferred that they be fully dissolved therein. If the coinitiator is a solvent for the dithiolate it will generally be desirable to use the coinitiator as a carrier when adding the dithiolate.

Solubility of the dithiolate can be modified by selection of the R or $R^1$ groups. For instance, Zn dibenzyldithiocarbamate is more soluble in (meth)acrylate capped thoxylated bisphenol A than is Zn dibutyldithiocarbamate. Consequently, although the UV-VIS spectra of the two compounds is quite similar, the dibenzyl compound appears much more active in that monomer system.

The R and $R^1$ groups can also effect the photoactivity of the absorption peak in the visible region (about 435 nm) not present in the dibutyl or dibenzyl compounds which makes it more sensitive to (short wavelength) visible light.

The level of ditholate should be in the range of 0.5%–5%, preferably 1% to 3% by weight of the composition.

The level of coinitiator should be at least 0.5% by weight of the composition. Generally optimal levels will be in the range of 1% to 5% by weight of the composition. In some compositions employing halogenated compounds as coinitiators, maximum cure speed may occur at levels of 10% or more of the halogenated compounds based on the total composition weight. However, those skilled in the art may find that at such levels properties of the cured polymer deteriorate and, therefore, may chose to sacrifice some cure speed to maintain good cured polymer properties.

Other agents such as thickeners, plasticizers, etc. are also known in the art and may advantageously be incorporated where functionally desirable, provided only that they do not interfere with the functioning of the composition for its intended purpose. This, of course, can be determined by simple experimentation.

The invention may be illustrated by the following non-limiting examples.

EXAMPLE 1

Formulations based on an ethoxylated bisphenol A diacrylate (Henkel Photomer 4028, 512 g/mole) were prepared as shown in Table 1 below. The dithiolate salt was dissolved in the monomer by mixing using ultrasonic vibration for 5 minutes. The co-initiator was added and mixed for 2 additional minutes. The viscosity of the mixtures was in the range of 800–1500 centipoise.

The mixture was stored in the dark in dark glass vials until cure tested. Cure testing comprised applying the mixture between a sodium chloride salt plate and an aluminum lap specimen and irradiating through the salt plate using IR filtered broad range UV light generated by a mercury lamp. The UV intensity was 350 mW/cm$^2$. The cure rate of the respective formulations was monitored using a real time FTIR technique by monitoring the disappearance of vinyl unsaturation.

TABLE I

| Composition | Formulation |
|---|---|
| A | Monomer only |
| B | 4.0 g monomer + 0.10 gm dibutyldithiolcarbamate |
| C | Composition B + 2.50 vol. % CCl$_4$ |
| D | Composition B + 12.50 vol. % CCl$_4$ |
| E | Composition B + 1.0 wt % MDEA[1] |
| F | Composition B + 2.0 wt % MDEA |
| G | Composition B + 2.2 wt % DBzANI[2] |
| H | 4.0 g monomer + 0.10 gm dibenzyldithiolcarbamate |
| I | Composition H + 2.50 vol % CCl$_4$ |
| J | Composition H + 12.50 vol % CCl$_4$ |
| K | Composition H + 2.00 vol % MDEA |

[1]Methyldiethanolamine
[2]N,N-dibenzylaniline

The times required for the monomer to reach specified percentages of conversion to polymer are tabulated in Table II. (The light intensity used for these tests is 350 mW/cm$^2$.) As shown in Table II, compositions C through G and I through K show a great enhancement of the polymerization rate.

TABLE II

| Composition | Average Time (sec) Needed to Reach Conversion of | | |
|---|---|---|---|
| | 30% | 50% | 60% |
| A | 285 | >300 | >300 |
| B | 250 | >300 | >300 |
| C | 18 | 93 | 292 |
| D | 8 | 36 | 85 |
| E | 95 | 235 | 300 |
| F | 5 | 20 | 74 |
| G | 105 | 165 | 215 |
| H | 270 | >300 | >300 |
| I | 10 | 38 | 180 |
| J | 8 | 17 | 90 |
| K | 37 | 85 | 163 |

EXAMPLE 2

The procedures of Example 1 were repeated with the formulations shown in Table III except that the UV intensity was 110 mW/cm$^2$.

TABLE III

| Composition | Formulation |
|---|---|
| A | monomer only |
| L | 4.0 g monomer + 0.10 gm zinc isopropyl xanthate |
| M | Composition L + 4.80 wt & MDEA |
| N | Composition L + 2.20 wt % DBzANI |
| O | Composition L + 2.85 wt % CCl$_4$ |

The times required for the monomer to reach specified percentage of conversion polymer are tabulated in Table IV.

TABLE IV

| Composition | Time (sec) Needed to Reach Conversion Of | | |
|---|---|---|---|
| | 20% | 40% | 50% |
| A | >300 | >300 | >300 |
| L | 146 | >300 | >300 |
| M | 64 | 160 | >300 |
| N | 40 | 228 | >300 |
| O | 9 | 18 | 105 |

EXAMPLE 3

The procedures of Example 1 were repeated using the formulations of Table V.

TABLE V

| Composition | Formulation |
|---|---|
| A | monomer only |
| P | 4.0 g monomer + 0.10 gm nickel dioctadecyldithiophosphate |
| Q | Composition P + 9.90 wt % MDEA |
| R | Composition P + 12.5 vol % CCl$_4$ |

The times required for the monomer to reach specified percentage of conversion to polymer are tabulated in Table VI.

TABLE VI

| Composition | Time (sec) Needed to Reach Conversion of | | |
|---|---|---|---|
| | 20% | 40% | 50% |
| A | >285 | >300 | >300 |
| P | 260 | >300 | >300 |
| Q | 7 | 12 | 42 |
| R | 2 | 6 | 10 |

EXAMPLE 4

The photobleaching effect of the inventive photoinitiation system in the visible and near UV regions is illustrated by monitoring the change of the UV absorption spectrum of copper dimethyldithiocarbamate in chloroform solution as a function of irradiation time. UV light intensity was 25 mW/cm$^2$. A stacked plot display of the absorption spectrum of the solution after 0, 1, 2, 3, 4 and 5 seconds of irradiation was prepared. The absorbance intensity at 420 nm wavelength rapidly decreased upon irradiation. This decrease corresponded to a fading of the color of the solution. Because of this photobleaching effect, the inventive photoinitiator systems can be used to cure formulations with light of about 380 nm wavelength or higher to depths well below the maximum typical for most nonbleaching photoinitiation systems.

What is claimed is:

1. A photoinitiator for initiating curing of free radically polymerizable ethylenically unsaturated compounds, the photoinitiator consisting essentially of:
   (a) a dithiolate component selected from the group consisting of transition metal xanthate salts and mixtures thereof; and
   (b) a coinitiator selected from the group consisting of:
      halogenated organic compounds,
      tertiary amines selected from the group consisting of trialkyl amines, one or more of the alkyl groups of which being optionally substituted by a hydroxy group; triphenylamine; N,N-dialkylaniline and dialkylanilines substituted in one or more of the ortho, meta, or para positions by the following groups: methyl, ethyl, isopropyl, t-butyl, n-pentyl, n-hexyl, phenyl, 3,4-tetramethylene, trifluoromethyl, hydroxy, ethoxy, methylthio, ethylthio, acetylthio, isopropylthio, fluoro, chloro, bromo and iodo; N-alkyl substituted cyclic amines; and polymers having tertiary amino groups, and mixtures thereof.

2. A photoinitiator as in claim 1 wherein the dithiolate component comprises a compound represented by the formula:

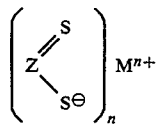

where Z is $R^1OC$, M is an n valent transition metal, n is 1, 2 or 3 and $R^1$ is a hydrocarbon group which is optionally substituted by one or more hydroxyl or halo groups or interrupted by one or more ether oxygen atoms.

3. A photoinitiator as in claim 2 wherein M is Zn, Cu, Ni, Co, Mo, Mn, Cr, Ru, Fe or V.

4. A photoinitiator as in claim 3 wherein M is Zn, Cu, Co and Ni.

5. A photoinitiator as in claim 1 wherein the coinitiator compound is halogenated hydrocarbon or a halogenated polymer.

6. A photoinitiator as in claim 1 wherein the coinitiator is a tertiary amine.

7. A photocurable composition comprising a free radically polymerizable ethylenically unsaturated compound and a photocuringly effective amount of a photoinitiator as in claim 1.

8. A composition as in claim 7 wherein the free radically polymerizable ethylenically unsaturated compound is a (meth)acrylic ester functional compound.

9. A composition as in claim 8 wherein the (meth)acrylic ester functional compound comprises at least two (meth)acrylic ester groups.

10. A composition as in claim 7 wherein the coinitiator is a said tertiary amine.

11. A composition as in claim 10 where the tertiary amine is a N,N-dialkylaniline.

12. A composition as in claim 7 wherein the coinitiator compound is a said halogenated organic compound.

13. A composition as in claim 12 wherein the halogenated organic compound is a halogenated hydrocarbon or halogenated organic polymer.

14. A composition as in claim 7 wherein the dithiolate component is present in an amount of between about 0.1% and 5% of the composition.

15. A composition as in claim 7 wherein the coinitiator component is present in an amount of between about 0.5% and 10% of the composition.

16. A process for forming a cured polymeric encapsulant over a substrate comprising applying a composition as in claim 7 to said substrate and irradiating the composition with actinic radiation.

17. A process as in claim 16 wherein the composition is applied to said substrate at a thickness of at least 2.5 mm.

18. A process as in claim 16 wherein the actinic radiation has a wavelength above about 380 nm.

19. A photoinitiator as in claim 1 wherein the dithiolate component comprises zinc isopropyl xanthate.

20. A photoinitiator as in claim 19 wherein the coinitiator is carbon tetrachloride.

* * * * *